United States Patent
Sasa et al.

(10) Patent No.: US 6,411,510 B2
(45) Date of Patent: Jun. 25, 2002

(54) HEAT SINK-EQUIPPED COOLING APPARATUS

(75) Inventors: Noriyasu Sasa, Hokkaido; Toshiki Ogawara, Tokyo; Michinori Watanabe, Tokyo; Haruhisa Maruyama, Tokyo, all of (JP)

(73) Assignee: Sanyo Denki Co., Ltd., Tokyo (JP)

( * ) Notice: Subject to any disclaimer, the term of this patent is extended or adjusted under 35 U.S.C. 154(b) by 0 days.

(21) Appl. No.: 09/778,312

(22) Filed: Feb. 7, 2001

(30) Foreign Application Priority Data

Feb. 8, 2000 (JP) .................................. 2000-069431
Feb. 6, 2001 (JP) .................................. 2001-030159

(51) Int. Cl.⁷ .............................................. H05H 7/20
(52) U.S. Cl. .................. 361/697; 165/80.3; 165/122; 165/124; 257/722
(58) Field of Search ................... 165/80.3, 121–124, 165/185; 174/16.3; 361/694–697; 257/722; 415/175–177

(56) References Cited

U.S. PATENT DOCUMENTS 5,019,880 A  * 5/1991 Higgins, III ................ 361/697
5,629,834 A  5/1997 Kodama et al.
5,782,292 A  7/1998 Ogawara et al.
5,785,116 A  7/1998 Wagner

FOREIGN PATENT DOCUMENTS

JP   3-15982   3/1982

* cited by examiner

Primary Examiner—Gregory Thompson
(74) Attorney, Agent, or Firm—Rakin, Hill, Porter & Clark LLP

(57) ABSTRACT

A heat sink-equipped cooling apparatus capable of exhibiting increased cooling performance and durability and being reduced in dimensions in a radial direction thereof. A heat sink includes a radiation fin unit including a plurality of radiation fins arranged so as to surround a virtual central line while keeping a center thereof aligned with the central line. A cooling fan includes an impeller including a plurality of blades and rotated through a motor. The cooling fan is mounted on the heat sink in such a manner that the impeller is positioned above the radiation fin unit of the heat sink. The radiation fins each are inclined with respect to a virtual vertical plane so as to form a predetermined inclination angle θ therebetween.

19 Claims, 13 Drawing Sheets

HEAT SINK-EQUIPPED COOLING APPARATUS

BACKGROUND OF THE INVENTION

This invention relates to a cooling apparatus equipped with a heat sink for dissipating heat emitted from a heat source, and more particularly to a heat sink-equipped cooling apparatus suitable for use for cooling an electronic component such as a CPU or the like.

Heat generated or emitted from an electronic component such as a CPU or the like used in a computer is progressively increased with an increase in performance of the electronic component. Japanese Utility Model Publication No. 15982/1991 discloses a cooling apparatus which is so constructed that a cooling fan is arranged above a heat sink having a plurality of radiation fins radially arranged on a front surface of a base plate thereof, to thereby permit air discharged from the cooling fan to be fed to a central region of the base plate and then outwardly exhausted through the radiation fins. Another conventional cooling apparatus is disclosed in U.S. Pat. No. 5,629,834 (corresponding to Japanese Patent No. 2,765,801 and Japanese Patent Application Laid-Open Publication No. 111302/1985) and U.S. Pat. No. 5,782,292 (corresponding to Japanese Patent Application Laid-Open Publication No. 102566/1997, which includes a heat sink having a plurality of radiation fins arranged in directions of flowing of air radially discharged from an impeller of a fan. In the cooling apparatus disclosed, the radiation fins are arranged so as to surround a part of the impeller of the fan. A further conventional cooling apparatus is disclosed in U.S. Pat. No. 5,785,116 (corres. to Japanese Patent Application Laid-Open Publication No. 219478/1998), which includes a heat sink having a plurality of radiation fins arranged on a base plate thereof so as to surround an impeller of a fan. The radiation fins are arranged in a manner to be inclined with respect to a central line extending through a center of the fan. In the cooling apparatus thus constructed, the heat sink including the plural radiation fins is formed by subjecting a cylindrical material to cutting which is carried out in a direction inclined with respect to a central line of the cylindrical material. Also, in the cooling apparatus, predetermined accurate relationship must be established between an angle of the radiation fins and an angle of the blades of the fan in order to permit the cooling apparatus to exhibit satisfactory cooling performance. Further, a motor of the fan is mounted on the heat sink.

The first and second conventional cooling apparatus described above each are not suitable for use for cooling an electronic component increased in heat generation. The third conventional cooling apparatus described above is suitable for cooling an electronic component increased in heat generation as compared with the first and second cooling apparatus. However, in the third cooling apparatus, the heat sink is increased in manufacturing cost and it is required to increase machining accuracy. Also, the third apparatus, as described above, is so constructed that the radiation fins are arranged so as to surround the impeller of the fan. Such arrangement causes a size of the cooling apparatus in a radial direction thereof to be significantly increased. Further, mounting of the motor of the fan on the heart sink in the third apparatus causes transmission of heat from the heat sink to the motor, leading to a deterioration in durability of the motor.

SUMMARY OF THE INVENTION

The present invention has been made in view of the foregoing disadvantage of the prior art.

Accordingly, It is an object of the present invention to provide a heat sink-equipped cooling apparatus which is capable of exhibiting increased cooling performance and durability and reducing a size thereof in a radial direction thereof.

It is another object of the present invention to provide a heat sink-equipped cooling apparatus which is capable of being reduced in manufacturing cost thereof.

It is a further object of the present invention to provide a heat sink-equipped cooling apparatus which is capable of being simplified in manufacturing thereof.

It is still another object of the present invention to provide a heat sink-equipped cooling apparatus which is capable of permitting the number of radiation fins arranged to be increased to a degree sufficient to enhance cooling performance of the cooling apparatus.

It is a still further object of the present invention to provide a heat sink-equipped cooling apparatus which is capable of permitting mass production thereof.

In accordance with the present invention, a heat sink-equipped cooling apparatus is provided. The cooling apparatus includes a heat sink for dissipating heat generated from a heat source. The heat sink includes a base plate increased in thermal conductivity and including a front surface and a rear surface with which the heat source is contacted, a virtual central line defined so as to extend in a direction perpendicular to the front surface of the base plate, a plurality of virtual vertical planes defined so as to extend in both a radial direction from the central line and a vertical direction perpendicular to the front surface of the base plate and be spaced from each other at equal intervals in a circumferential direction of a virtual circle defined about the central line, and a radiation fin unit mounted on the front surface of the base plate in a manner to be heat-transferable and including a plurality of radiation fins arranged so as to surround the central line while aligning the central line with a center in arrangement of the radiation fins. The cooling apparatus also includes a cooling fan including an impeller which includes a plurality of blades and is rotated by a motor and mounted on the heat sink so that the impeller is positioned above the radiation fin unit.

In the heat sink, the radiation fins each include a lower edge positioned on a side of the base plate, an upper edge positioned opposite to the lower edge, and a radiation surface positioned between the lower edge and the upper edge. The radiation fins each are fixedly mounted directly or indirectly on the front surface of the base plate so as to be positioned on an intersection line between the virtual vertical plane corresponding to each of the lower edges and the front surface of the base plate. Also, the radiation fins each are arranged while being inclined in an identical direction with respect to the virtual vertical plane (or toward one side in the circumferential direction of the virtual circle) so that an inclination angle θ of predetermined degrees between the radiation surface of the radiation fin and the virtual vertical plane may be defined. The radiation fin unit and cooling fan are arranged in positional relationship to each other which permits each of the blades of the cooling fan and the upper edge of each of the radiation fins to be opposite to each other. The cooling fan is arranged so as to permit cooling air to be fed to the radiation fins of the radiation fin unit. For this purpose, the cooling fan may be operated so as to blow air against the radiation fins. Alternatively, it may be operated so as to suck air from a side of the radiation fins.

When the impeller of the cooling fan and the heat sink are arranged in proximity to each other, air fed from the fan is substantially kept from being fed to a portion of the heat sink which is not opposite to the blades of the fan or a portion of the heat sink which is opposite to a cup member on which the blades of the impeller are fixed. Also, an air stream generated due to rotation of the impeller is not permitted to flow in an axial direction of the motor but is caused to flow in a direction of rotation of the impeller. Thus, arrangement of the radiation fins in a mere radial manner causes the radiation fins to act as flow resistance, to thereby fail to permit an increase in cooling performance of the cooling apparatus. This is also true of a structure which is constructed so as to forcibly flow air in a radial direction using an axial fan adapted to feed air in an axial direction, to thereby flow the air around radiation fins positioned outside an impeller, leading to cooling of the radiation fins. On the contrary, the structure of the present invention that air fed in the axial direction of the motor from the cooling fan is blown against the radiation fins from above the radiation fin unit enhances cooling performance of the cooling unit. Although this is not clearly supported by any specific theory, it would be considered that arrangement of the radiation fins employed in the present invention reduces flow resistance to air discharged from the cooling fan and produces a rapid air stream along the radiation surface of each of the radiation fins, to thereby increase the cooling performance. Thus, the cooling apparatus of the present invention exhibits cooling performance at substantially the same level as an expensive cooling apparatus conventionally used without being increased in dimensions in a radial direction thereof and ensuring satisfactory durability of the motor.

Ideally, the plural virtual vertical planes are defined so as to be spaced from each other at equal intervals in the circumferential direction of the virtual circle. This ensures substantially uniform cooling of each of the radiation fins and base plate, to thereby further enhance cooling efficiency of the cooling apparatus.

The radiation fin unit may be formed by subjecting a single metal plate increased in thermal conductivity to bending. This reduces a manufacturing cost of the cooling apparatus and facilitates manufacturing thereof.

In the present invention, the radiation fin unit may be constructed so as to attain both simplified manufacturing of the cooling apparatus and mass production thereof. More specifically, a single fan mounting metal plate joined to the front surface of the base plate is provided. The radiation fins each are formed of a flat metal plate. Also, the radiation fins each are fixed at the lower edge thereof on the fin mounting metal plate. The radiation fins may be mounted on the fin mounting metal plate in any suitable manner. For example, the radiation fins each are integrally mounted at the lower edge thereof with a flange for fixing. The flange is arranged so as to extend along a surface of the fin mounting metal plate and fixed on the surface of the fin mounting metal plate. The flange highly facilitates mounting of the radiation fins on the fin mounting metal plate.

The present invention may be constructed so as to further promote mass production of the cooling apparatus. For this purpose, the fin mounting metal plate is formed with a plurality of slits in a manner to radially extend from the central line and be spaced from each other at predetermined intervals in the circumferential direction. The radiation fins each are integrally formed at the lower edge thereof with a fit projection which is fitted in each of the slits. Also, the radiation fins each are joined to the fin mounting metal plate while keeping the fit projection fitted in each of the slits. This facilitates not only positioning of the radiation fins on the fin mounting metal plate, but joining of the radiation fins to the fin mounting metal plate while keeping the radiation fins inclined.

Alternatively, the base plate may be formed with a plurality of slits in a manner to radially extend from the central line and be spaced from each other at predetermined intervals in the circumferential direction. In this instance, the radiation fins each are integrally formed at the lower edge thereof with a fit projection which is fitted in each of the slits. Also, the radiation fins each are joined to the fin mounting metal plate while keeping the fit projection fitted in each of the slits. This reduces the number of parts required although it somewhat increases a manufacturing cost of the apparatus. Alternatively, the radiation fins each equipped with the fixing flange may be directly fixed on the front surface of the base plate.

The radiation fins may be formed into the same configuration. This leads to a reduction in manufacturing cost of the radiation fins and therefore the cooling apparatus. In order to cut out a number of radiation fins from a single large-sized metal plate by punching with increased yields, the radiation fins each preferably have a main portion formed into a substantially rectangular shape. Thus, the radiation fin unit is permitted to be provided at a central portion thereof with a space of a frust conical configuration while having a center positioned on a central line of the radiation fin unit and being gradually reduced in diameter toward the base plate.

The inclination angle $\theta$ of the radiation fins is basically varied depending on the number of radiation fins. An increase in number of radiation fins leads to a reduction in inclination angle, whereas a decrease in the number leads to an increase in inclination angle. However, the inclination angle $\theta$ is preferably less than 45 degrees. The inclination angle of 45 degrees or more leads to a reduction in number of the radiation fins, to thereby cause a deterioration in cooling performance of the radiation fins. More preferably, the inclination angle $\theta$ is less than 45 degrees and more than 15 degrees, because it increases the number of radiation fins to a degree sufficient to ensure satisfactory cooling performance of the radiation fin unit.

The cooling fan is preferably constituted by a so-called axial fan. The blades of the cooling fan are preferably inclined in a direction identical with a direction in which the radiation fins are inclined. In this instance, the cooling fan may be operated to rotate the impeller in the direction in which the radiation fins are inclined. This enhances cooling performance of the cooling fan.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Now, a heat sink-equipped cooling apparatus according to the present invention will be described with reference to the accompanying drawings.

Figure 1:
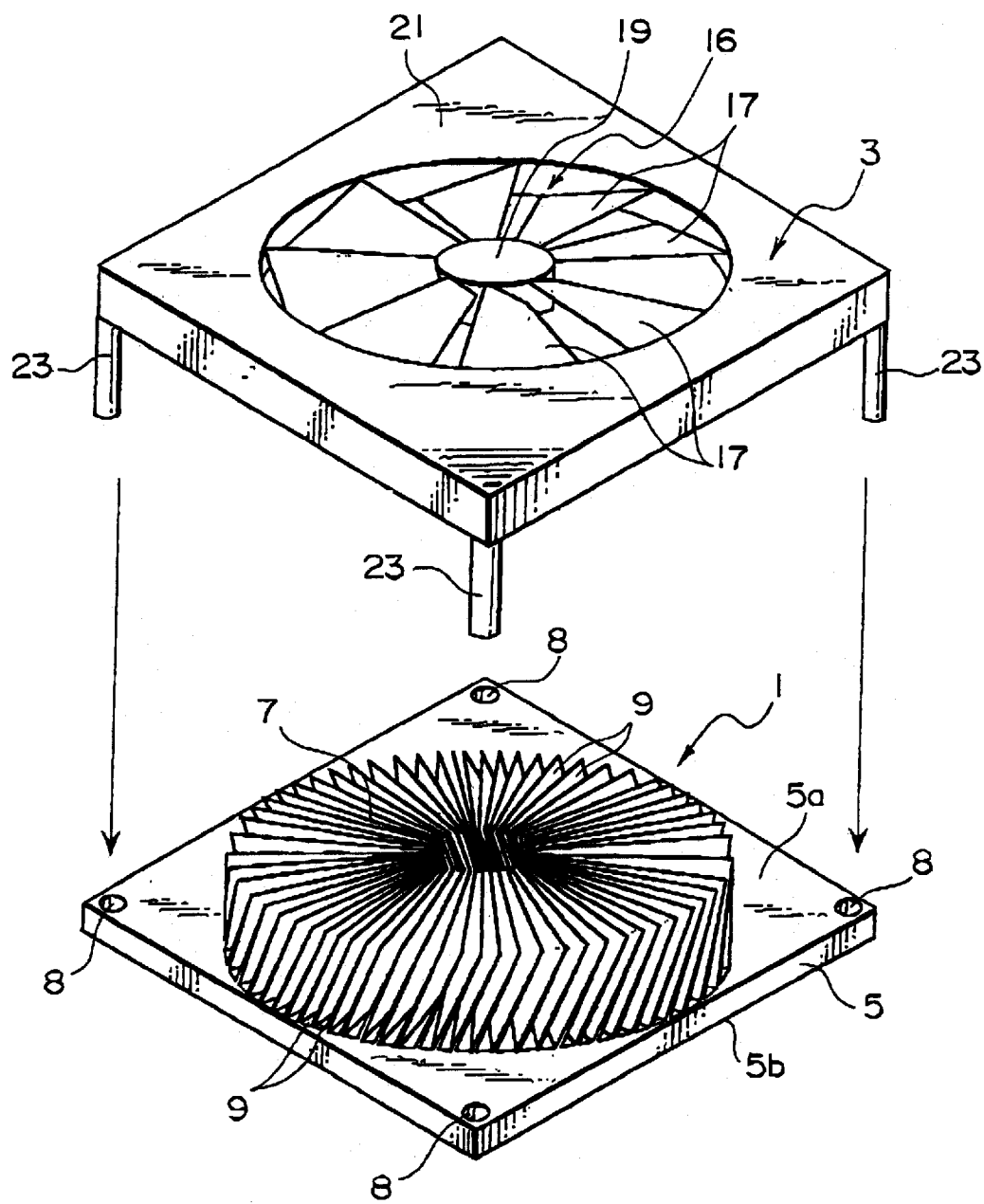
FIG. 1 is a schematic exploded perspective view showing a first embodiment of a heat sink-equipped cooling apparatus according to the present invention.

Referring first to FIGS. 1 to 5, a first embodiment of a heat sink-equipped cooling apparatus according to the present invention is illustrated. A heat sink-equipped cooling apparatus of the illustrated embodiment, as shown in FIG. 1, generally includes a heat sink 1 and a cooling fan 3.

The heat sink 1 includes a base plate 5 having a front surface 5a and a rear surface 5b with which a heat source is contacted, as well as a radiation tin unit 7. The base plate 5 may be made of a metal material such as, for example, aluminum alloy or copper alloy or a plate-like structure exhibiting an internal heat pipe function. Alternatively, it may be made of a non-metal material such as a carbon sheet or the like. The base plate 5 is formed at each of four corners thereof with a through-hole 8.

Figure 2:
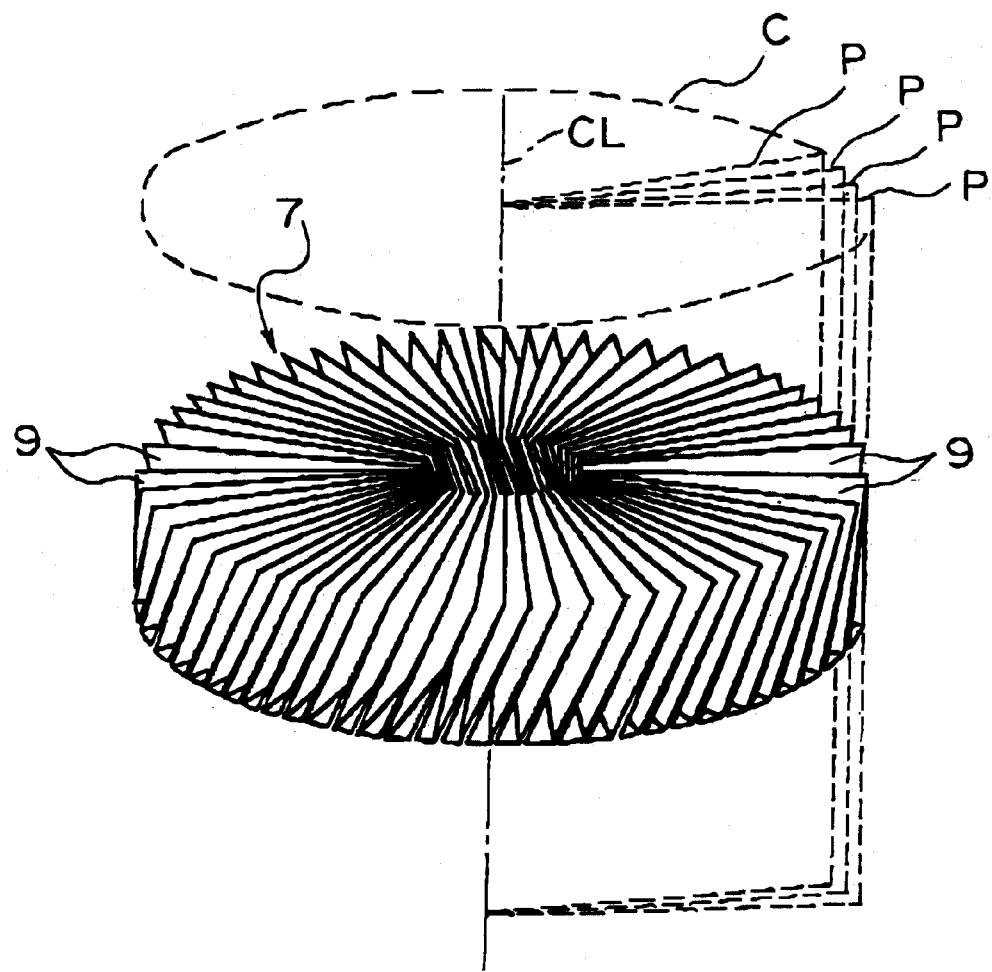
FIG. 2 is a perspective view showing a radiation fin unit incorporated in the heat sink-equipped cooling apparatus of FIG. 1.
Figure 6:
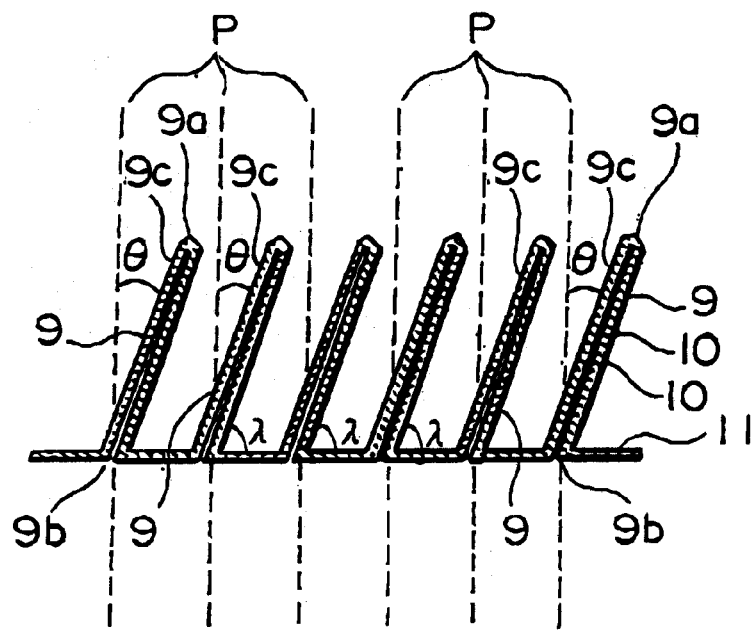
FIGS. 6 and 7 each are a schematic enlarged sectional view showing an inclination angle of radiation fins of the radiation fin unit of FIGS. 3 to 5.
Figure 7:
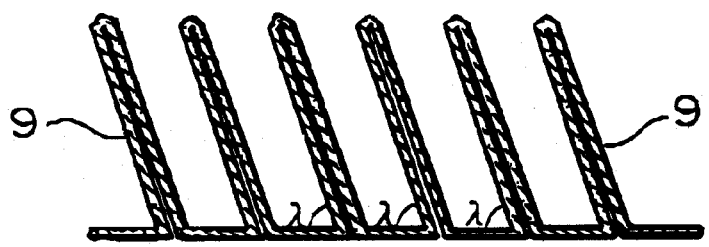

The radiation fin unit 7, as shown in FIG. 2, includes a plurality of radiation fins 9 arranged in a manner to surround a virtual central line CL defined so as to extend in a direction perpendicular to the front surface 5a of the base plate 5 while aligning the central line CL with a center of arrangement of the radiation fins 9. In the illustrated embodiment, in order to specify a configuration of the radiation fins 9 and a posture of the radiation fins 9 with respect to the base plate 5, a plurality of virtual vertical planes P are supposed which are defined so as to extend in both a radial direction from the central line CL and a vertical direction perpendicular to the front surface 5a of the base plate 5 and be spaced from each other at equal intervals in a circumferential direction of a virtual circle C defined about the central line CL, as shown in FIG. 2. The plural radiation fins 9 are arranged so as to surround the central line CL while aligning it with the center of arrangement of the radiation fins 9. The plural radiation fins 9, as shown in FIG. 6, each include a lower edge 9a positioned on a side of the base plate, an upper edge 9b positioned opposite to the lower edge 9a, and a radiation surface 9c positioned between the lower edge 9a and the upper edge 9b. The radiation fins 9 each are fixedly mounted on the front surface of the base plate 5 so as to be positioned on an intersection line between the virtual vertical plane P corresponding to each of the lower edges 9a and each of the radiation fin mounting sections 11 contacted with the front surface 5a of the base plate 5. In the illustrated embodiment, the radiation fins 9 each are formed by bending of a metal plate as described below, resulting in being made of two plates 10. The radiation fins 9 each are arranged inclinedly or while being kept inclined so that an angle (inclination angle) θ between the radiation surface 9c of the radiation fin 9 and the virtual vertical plane P is less than 45 degrees. More specifically, the plural radiation fins 9 each are inclined in the same direction with respect to the virtual vertical plane P corresponding thereto or toward one side in the circumferential direction of the virtual circle C. The inclination angle θ is preferably set to be less than 45 degrees and more than 15 degree. The angle set within such a range permits the number of radiation fins 9 arranged to be increased to a degree sufficient to permit the cooling apparatus of the illustrated embodiment to exhibit satisfactory cooling performance. Alternatively, inclination of the radiation fins 9 may be defined by means of an angle λ between each of the radiation fins 9 and each of the radiation fin mounting sections 11. The angle λ is preferably set to be more than 45 degrees and less than 85 degrees (45°<λ<85°). Such an angular range reduces a pressure loss of air flow, to thereby increase a velocity of air flow occurring between the radiation fins 9 as compared with the case of λ=90°. This permits the amount of air discharged from the cooling apparatus to be increased, so that it may be increased in cooling efficiency. An optimum value of each of the angles θ and λ may be determined depending on a direction of rotation of an impeller of the cooling fan 3 and a rotational speed thereof, an angle of blades of the impeller, and an area of the radiation fins opposite to the blades. Also, a direction in which the radiation fins 9 are inclined may be opposite to that shown in FIG. 6, as shown in FIG. 7.

When a total radiation area of the radiation fins 9 is indicated at F and an area of the front surface 5a of the base plate 5 is indicated at S, the radiation fin unit 7 is preferably constructed so that a ratio C=F/S is more than 10 and less than 40 (10<C<40). However, such conditions are not necessarily required in the present invention.

Figure 3:
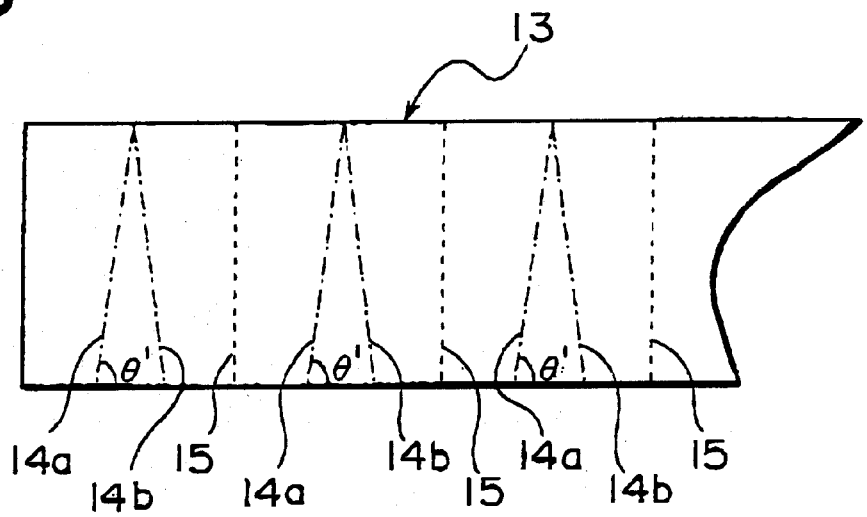
FIGS. 3 to 5 each are a schematic view showing manufacturing of the radiation fin unit of FIG. 2 by way of example.
Figure 4:
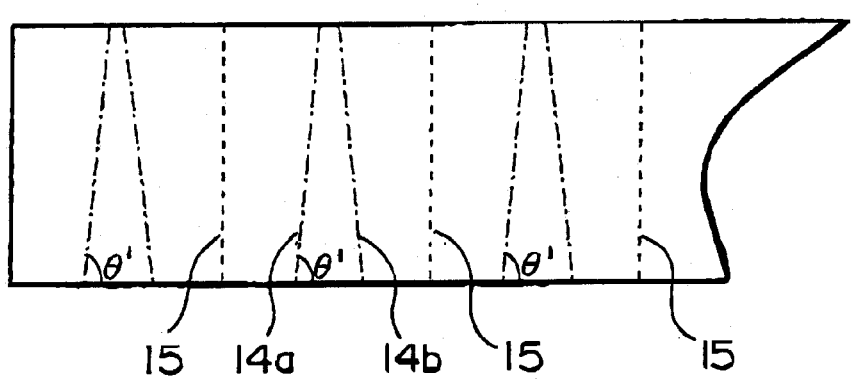
Figure 5:
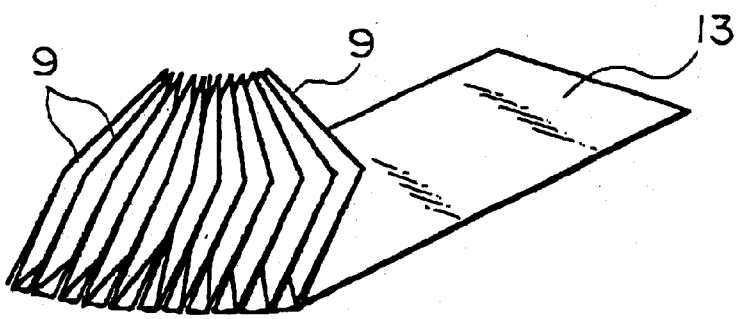

Now, manufacturing of the radiation fin unit 7 constructed as described above will be described. First, a thin metal plate 13 of an elongated shape which has a thickness of, for example, 1 mm or less is prepared as shown in FIG. 2. Then, trough lines 14a and 15b and crest lines 15 are described on the plate 13. Thereafter, as shown in FIG. 5, the plate 13 is subjected to repeated bending along the trough lines 14a and 14b and crest lines 15 and then both ends of the plate 13 are joined to each other, leading to completion of the radiation fin unit 7 of an annular configuration as shown in FIG. 2. The trough lines 14a and 14b in each pair shown in FIG. 3 are arranged so as to directly intersect each other on the plate 13. Alternatively, as shown in FIG. 4, the trough lines 14a and 14b may be arranged so as to intersect each other on virtual extension lines thereof extending to an exterior of the plate 15. In the radiation fin unit thus completed, the two trough lines 14a and 14b positioned on each of both sides of each of the crest lines 15 cooperate with each other to define each of the lower edges of the radiation fin 9.

In each of FIGS. 3 and 4, the trough lines 14a and 14b are arranged so as to define an angle θ' therebetween while being kept from being parallel to each other. The above-described inclination angle θ or λ of each of the radiation fins 9 is determined depending on the angle θ'.

Joining between the base plate 5 and the radiation fin unit 7 is desirably carried out using a thermal conductive adhesion or by soldering, brazing, welding, ultrasonic welding or the like, because it is required to efficiently transmit heat from the base plate 5 to the radiation fin unit 7.

Returning to FIG. 1, the cooling fan 3 includes the impeller briefly described above which is designated at reference numeral 16. The impeller 16 includes the plural blades briefly described above which are designated at reference numeral 17 and is rotated by a motor 19. The motor 19 includes a housing supported on a casing 21 through a plurality of webs (not shown). The casing 21 includes a lower surface, which is integrally provided on each of four corners thereof with a pillar 23. The four pillars 23 each are formed on a lower end thereof with a threaded hole, in which a threaded portion of a screw inserted via a through-hole 8 formed via each of four corners of the base plate 5 from the rear surface 5b of the base plate 5 to the front surface 5a thereof is threadedly fitted. The cooling fan 3 is fixed on the base plate 5 by means of the screws (not shown) inserted via the through-holes 8 while keeping the pillars 23 abutted against the front surface 5a of the base plate 5. This permits the radiation fin unit 7 and cooling fan 3 to be arranged in positional relationship which permits each of the blades 17 of the cooling fan 3 and the upper edge 9a of each of the radiation fins 9 to be opposite to each other. Each of the blades 17 and the upper edge 9a of each of the radiation fins 9 are so positioned that a gap therebetween is set to be within a range of, for example, between about 5 mm and about 10 mm. In the illustrated embodiment, the blades 17 of the cooling fan 3 are arranged at an angle which permits air to be blown against the radiation fins 9 of the radiation fin unit 7.

Then, air which has been thus blown against the radiation fin unit 7 from the cooling fan 3 is permitted to enter a gap between each adjacent two radiation fins 9 through an opening defined between the upper edges 9a of each adjacent two radiation fins 9 and then be radially outwardly discharged from the radiation fin unit 7 through the gap.

Figure 8:
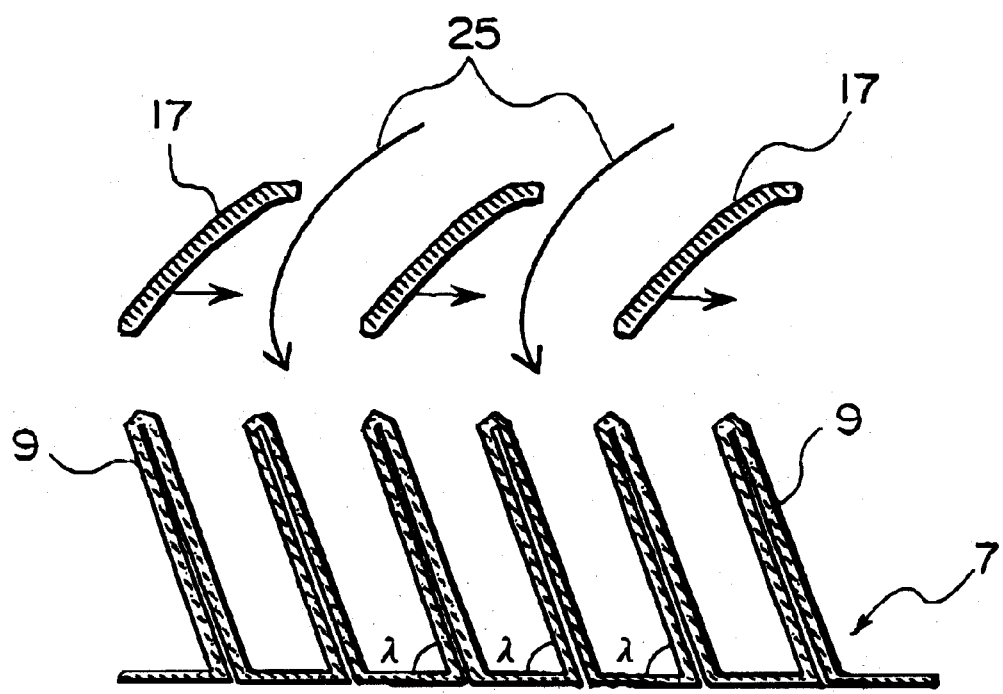
FIG. 8 is a schematic sectional view showing relationship between the radiation fins of FIGS. 6 and 7 and blades of an impeller incorporated in the cooling apparatus of FIG. 1.

When the impeller 16 of the cooling fan 3, as shown in FIG. 8, is rotated in a right-hand direction in FIG. 8, air sucked from an upper portion of the blades 17 is permitted to have a component in the direction of rotation of the impeller 16, to thereby be discharged in directions of arrows indicated at reference numeral 25, resulting in pressure loss of the air being reduced. Such a reduction in pressure loss permits the fins to be arranged at significantly increased density, to thereby further enhance cooling efficiency of the radiation fin unit 7.

A heat sink which has dimensions of 50 mm×50 mm×15 mm, an angle λ of 55 degrees (angle θ of 45 degrees) and C of 17.4 was made of aluminum according to the above-described construction of the illustrated embodiment. Then, the heat sink thus manufactured was subjected to a test of cooling performance under the conditions that the impeller of the axial fan is set at a rotational speed of 4000 rpm and a heat source of 34W in power is kept contacted with the rear surface of the base plate of the heat sink. As a result, it was confirmed that air is discharged at a flow velocity of 2.8 m/s from an outer periphery of the cooling fan unit of the heat sink and a temperature of the heat source is raised to a level of 42° C.

Also, a comparative test was carried out using a heat sink wherein an inclination angle θ of each of radiation fins is set to be 0 degree (λ=90°). As a result, the best cooling performance was obtained at λ=90°, C=8.2. At this time, a flow velocity of air discharged was 2.1 m/s and a temperature of a heat source was increased to a level of 48° C.

Referring now to FIGS. 9 to 16, a second embodiment of a heat sink-equipped cooling apparatus according to the present invention is illustrated. In connection with the illustrated second embodiment, reference numerals correspond to those discussed in the first embodiment described above, except with an additional prefix of 100. The illustrated embodiment is essentially different in structure and manufacturing of a heat sink from the first embodiment described above. In the first embodiment, the radiation fin unit for the heat sink 1 is formed of a single thin metal plate by bending. On the contrary, in the illustrated embodiment, a radiation fin unit 107 includes a plurality of radiation fins 109 each formed of a flat metal plate made by punching. Then, the radiation fins 109 each are joined at a lower edge 109b thereof (FIG. 14) to a fin mounting metal plate 108, resulting in the radiation fin unit 107 being manufactured.

Figure 14:
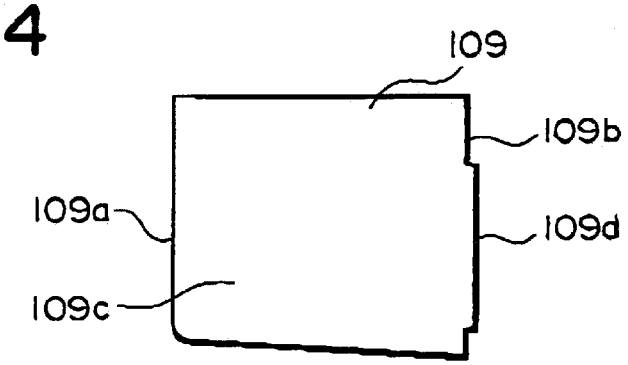
FIG. 14 is a schematic plan view showing one of radiation fins incorporated in the heat sink-equipped cooling apparatus shown in FIG. 9.
Figure 15:
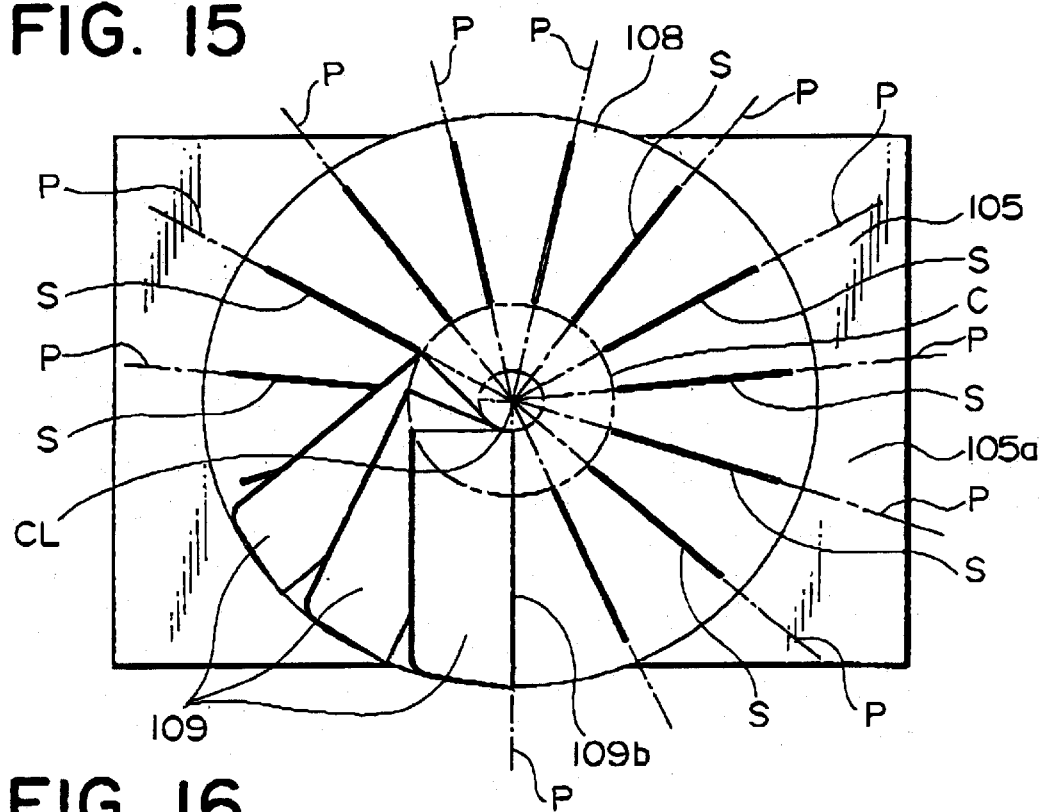
FIG. 15 is a schematic plan view showing manufacturing of the radiation fin unit of FIG. 12.
Figure 16:
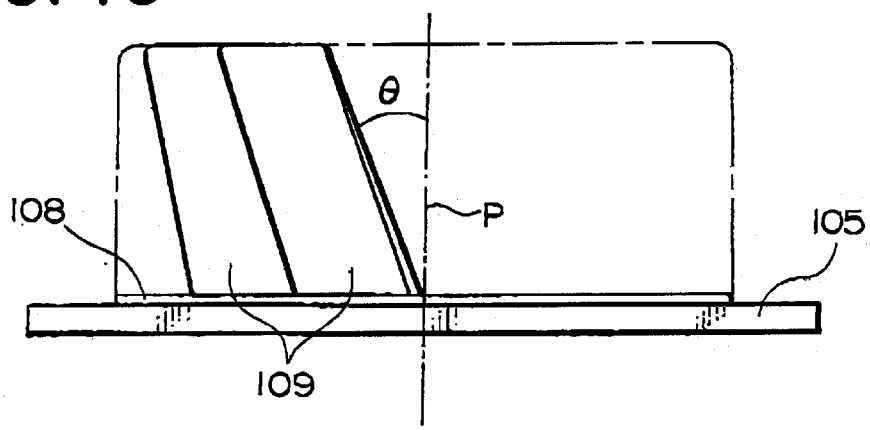
FIG. 16 is a schematic front elevation view showing manufacturing of the radiation fin unit of FIG. 12.

Now, manufacturing of the radiation fin unit 107 will be described with reference to FIGS. 14 to 16. The radiation fins 109, as shown in FIG. 14, each include in addition to the lower edge 109b, an upper edge 109a positioned opposite to the lower edge 109b and a radiation surface 109c positioned between the lower edge 109b and the upper edge 109a. The lower edge 109b of each of the radiation fins 109 is integrally provided with a fit projection 109d. The fin mounting metal plate 108 is formed into a disc-like shape and made so as to exhibit increased thermal conductivity. The fin mounting metal plate 108, as shown in FIG. 15, is formed with a plurality of slits S so as to radially extend from a central line CL and be spaced from each other at predetermined intervals in a circumferential direction of a virtual circle C. The slits S each are included in each of a plurality of virtual vertical planes P defined so as to extend in both a radial direction from the central line CL and a direction perpendicular to a surface of the fin mounting metal plate 108 and be spaced from each other at predetermined intervals in the circumferential direction of the virtual circle C. The slits S each are formed into a width larger than a thickness of the radiation fin 109 and formed into dimensions which permit each of the radiation fin 109 to be inclined at a predetermined angle θ in a circumferential direction of the virtual circle C while keeping each of the fit projections 109d fitted in each of the slits S.

After the fit projection 109d of each of the radiation fins 109 is fitted in the slit S, the radiation fin 109 is inclined toward one side in the circumferential direction of the virtual circle C (or in a counterclockwise direction in FIG. 15), so that the lower edge 109b may be joined to the fin mounting metal plate 108 in a manner to be heat-transferable or in a manner to permit heat transfer to be carried out therebetween. Alternatively, the joining may be carried out by means of an adhesive increased in thermal conductivity or by soldering or the like. The radiation fins 109 may be joined to the fin mounting metal plate 108 in order. Alternatively, the joining may be executed by respectively fitting the fit projections 109d of the radiation fins 109 in the slits S and concurrently inclining the radiation fins 109 as described above while previously applying a thermosetting adhesive to a surface of the fan mounting metal plate 108, followed by curing of the adhesive. This results in the radiation fin unit 107 being readily manufactured at a reduced cost. The slits S highly facilitate positioning of the radiation fins 109 and joining of the radiation fins 109 to the fin mounting metal plate 108.

The thus-manufactured radiation fin unit 107 is joined to a front surface 105a of a base plate 105 using a joint means increased in thermal conductivity. This results in providing a heat sink structure which is constructed so that the radiation fins 109 each may be fixed indirectly on the front surface 105a of the base plate 105 while being positioned along an intersection line between the virtual vertical plane P corresponding to the lower edge 109b of the radiation fin 109 and the front surface 105a of the base plate 105, and the radiation fins 109 each may be inclined in an identical direction with respect to the virtual vertical plane P (or toward one side in the circumferential direction of the virtual circle C) so as to form a predetermined inclination angle θ between the radiation surface 109c of the radiation fin 109 and the virtual vertical plane P. In the illustrated embodiment, the base plate 105 and radiation fin unit 107.each may be formed of copper alloy.

Figure 12:
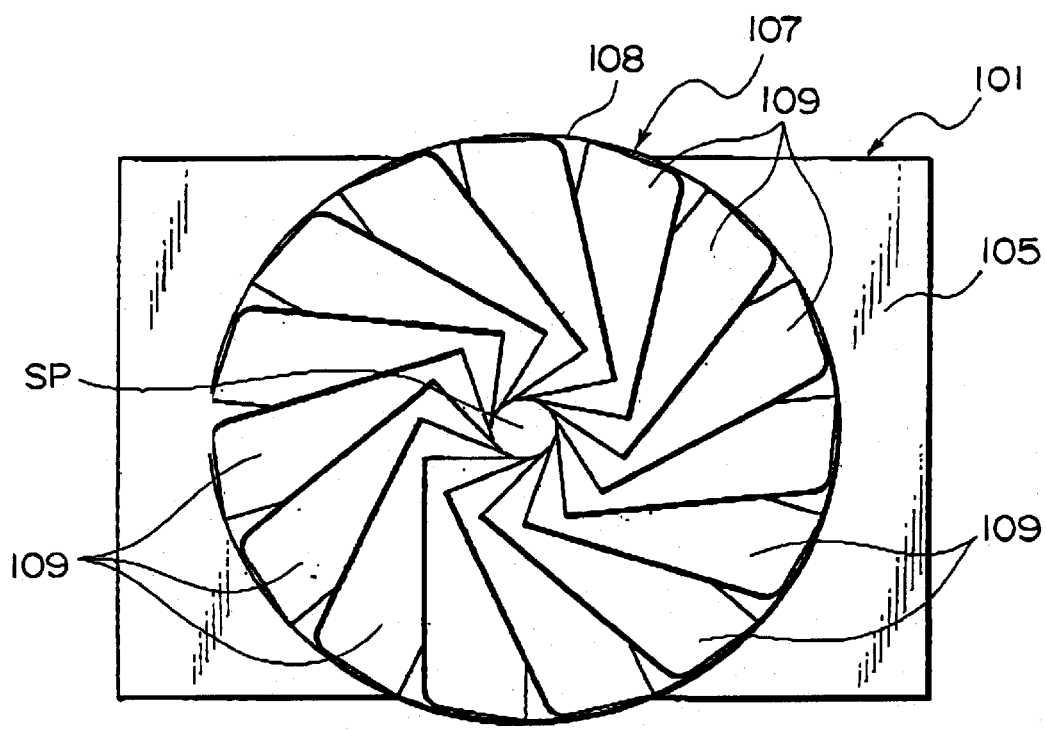
FIG. 12 is a schematic plan view showing a radiation fin unit incorporated in the heat sink-equipped cooling apparatus of FIG. 9.
Figure 13:
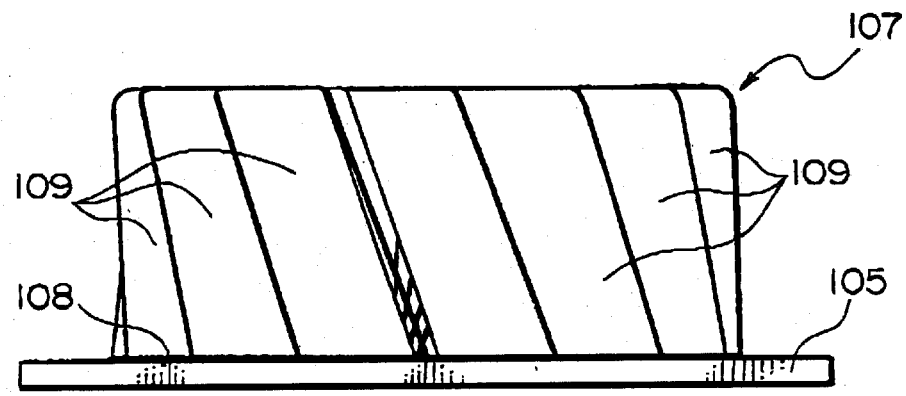
FIG. 13 is a schematic front elevation view of the radiation fin unit shown in FIG. 12.

As will be noted from FIG. 12, the radiation fin unit 107 including the radiation fins 109 each having a main section formed into a rectangular shape permits a space SP of a substantially frust-conical shape to be formed in the radiation fin unit 107 while having a center positioned on or aligned with a central line of the radiation fin unit and being gradually reduced in diameter toward the base plate 105.

Figure 9:
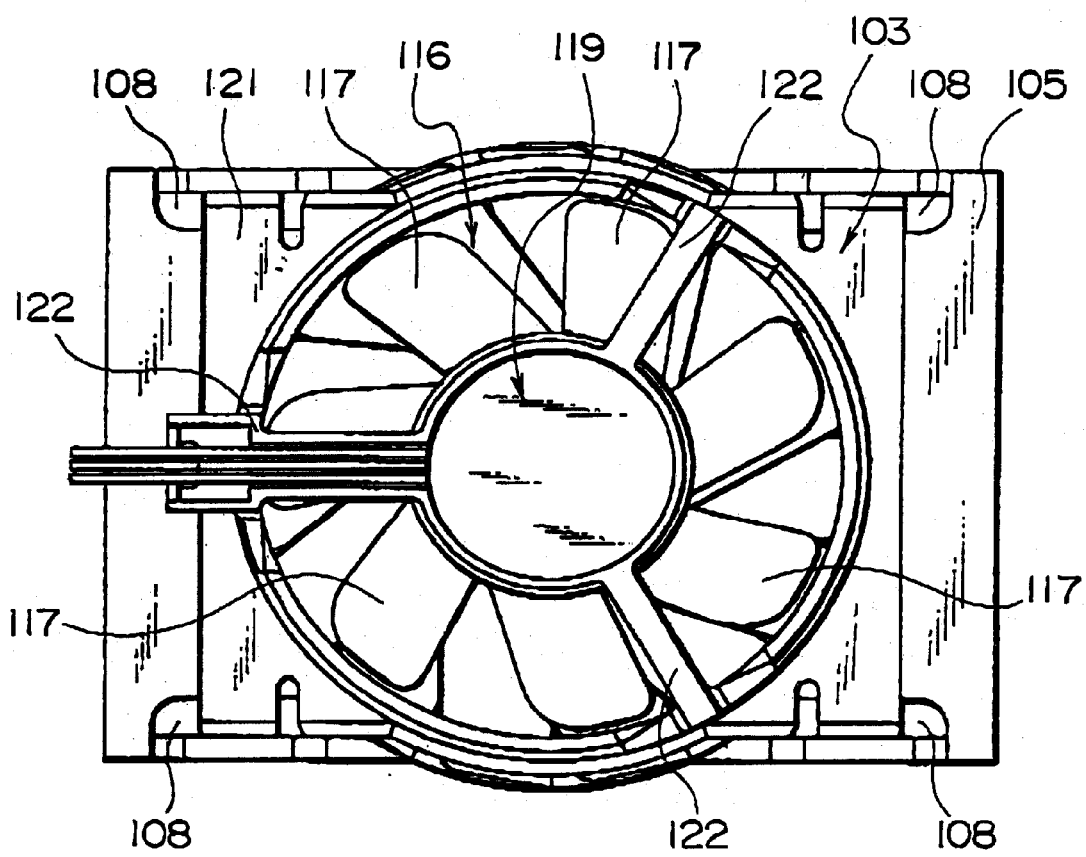
FIG. 9 is a plan view showing a second embodiment of a heat sink-equipped cooling apparatus according to the present invention.
Figure 10:
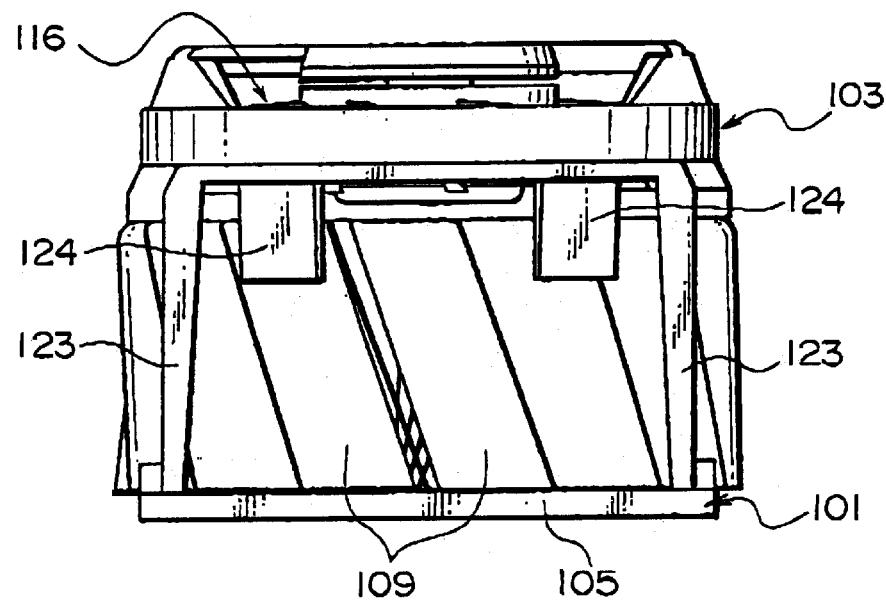
FIG. 10 is a right side elevation view of the heat sink-equipped cooling apparatus shown in FIG. 9.
Figure 11:
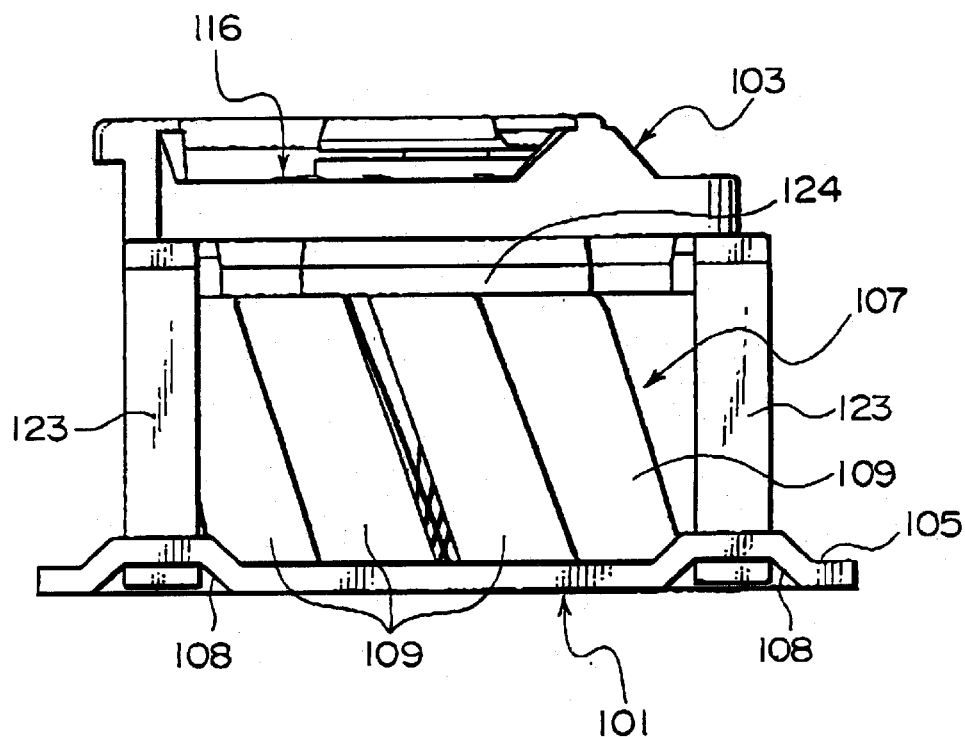
FIG. 11 is a front elevation view of the heat sink-equipped cooling apparatus shown in FIG. 9.

The cooling fan 103 shown in FIGS. 9 to 11 includes a casing 121 integrally formed of a synthetic resin material. The casing 121 includes a casing body 121b provided with an air duct 121a in a manner to surround at least a part of a periphery of an impeller 116, three webs 122 for supporting a housing of a motor 119 on the casing body 121b, and four pillars 123 each mounted at one end thereof on the casing body 121b and held at the other end thereof on the base plate 105. The casing body 121b is provided with a plurality of contact sections 124 which are contacted with an outer surface of the radiation fin unit 107 to prevent lateral movement of the casing 121. The pillars 123 each are provided at the other end thereof with a hook acting as a held portion. Correspondingly, the base plate 105 is formed at each of four corners with a through-hole 108 acting as a holding portion in which the hook of each of the pillars 123 is held.

The illustrated embodiment is different in relationship between blades of the impeller and the radiation fins from the first embodiment described above. More specifically, in the illustrated embodiment, a plurality of blades 117 of the impeller 116 are arranged in the same direction as the radiation fins 109. Also, the cooling fan 103 is operated to rotate the impeller 107 in a direction in which the radiation fins 109 are inclined. Such configuration permits the cooling apparatus of the illustrated embodiment to be increased in cooling performance as compared with the contrary case.

In the illustrated embodiment as well, the inclination angle θ of the radiation fins 109 and the like may be set as in the first embodiment described above.

Figure 17:
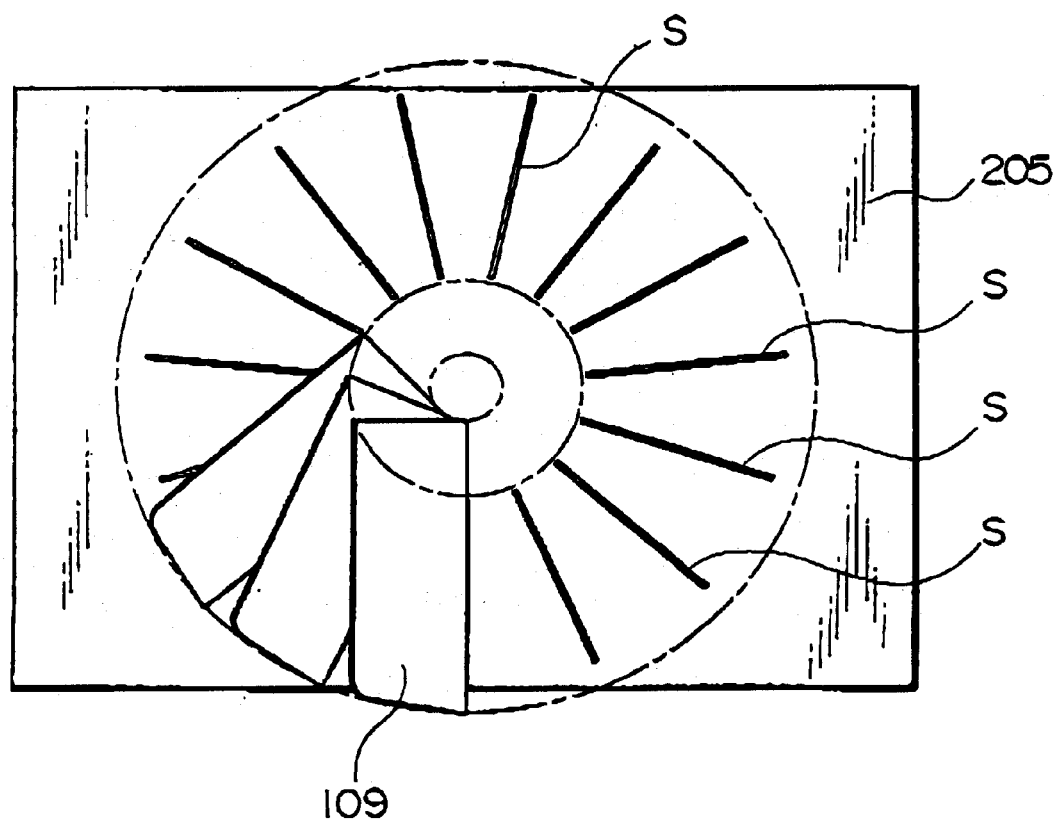
FIG. 17 is a schematic plan view showing manufacturing of a modification of the radiation fin unit shown in FIG. 12.

In the illustrated embodiment, the radiation fins 109 are fixed on the fin mounting metal plate 108. Alternatively, as shown in FIG. 17, a base plate 205 may be formed with a plurality of slits S. The slits S thus formed each have the fit projection 109d of each of the radiation fins 109 to be fitted therein, to thereby construct the heat sink.

Figure 18A:
FIG. 18A is a schematic side elevation view showing another modification of the radiation fin shown in FIG. 14.
Figure 18B:
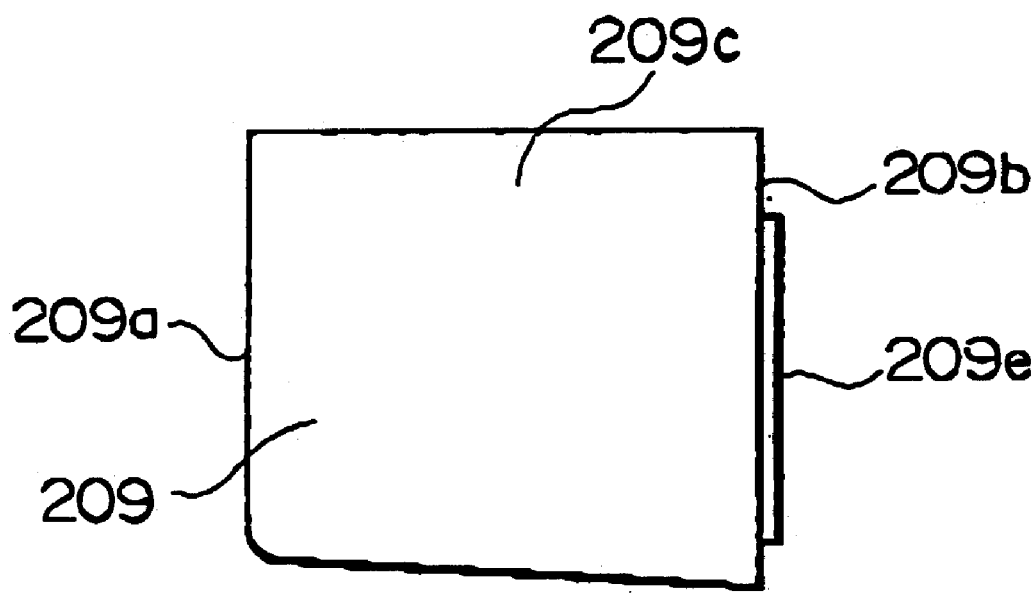
FIG. 18B is a schematic front elevation view of the radiation fin shown in FIG. 18A.
Figure 19:
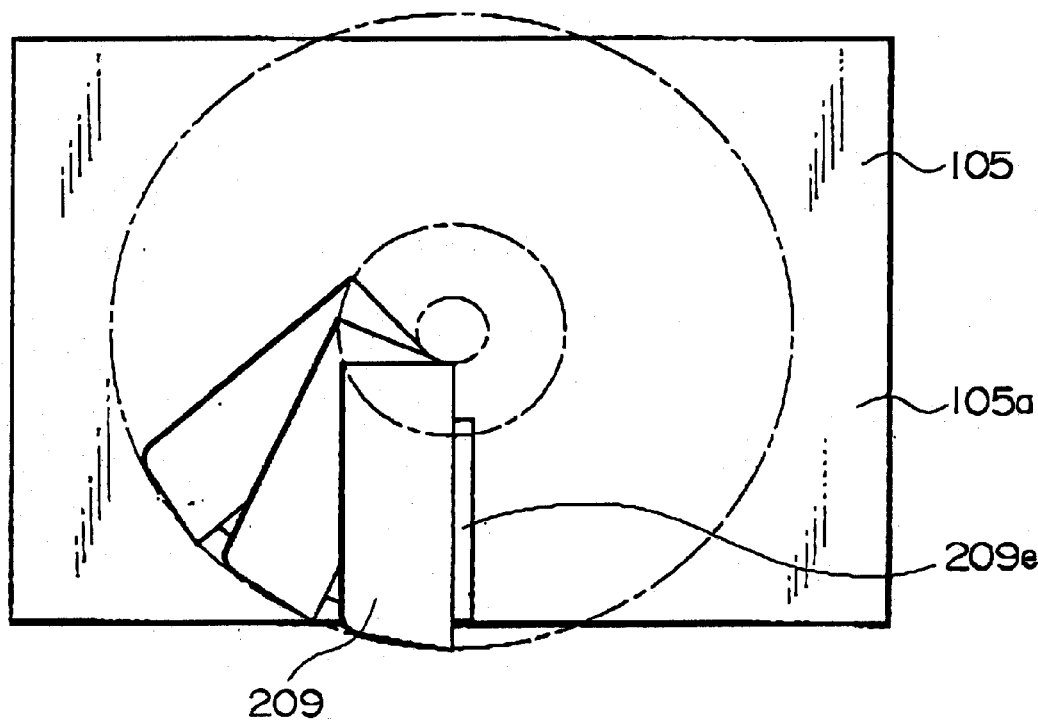
FIG. 19 is a schematic plan view showing manufacturing of another modification of the radiation fin unit of FIG. 12.
Figure 20:
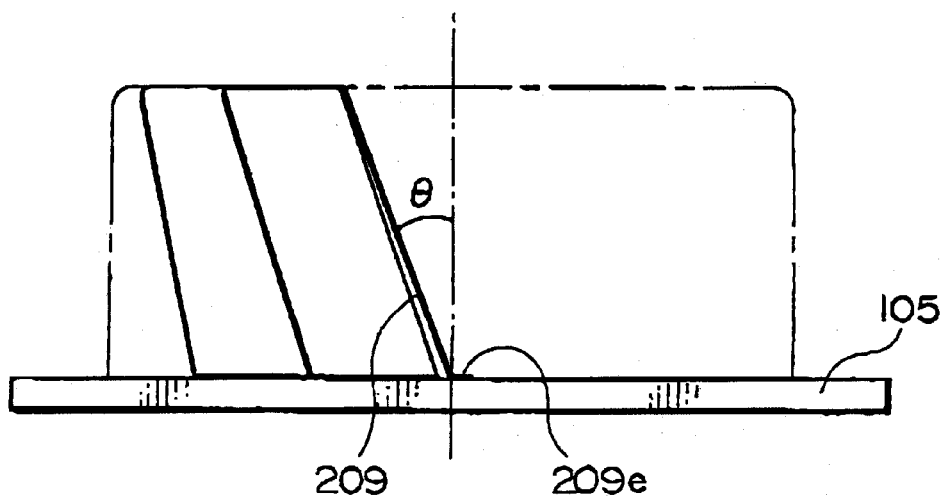
FIG. 20 is a schematic front elevation view showing manufacturing of another modification of the radiation fin unit of FIG. 12.

Also, the radiation fin unit may be configured as shown in FIG. 18. In FIG. 18, radiation fins 209 each are provided at a lower edge 209b thereof with a flange 209e for fixing. In this instance, a radiation surface 209c and the flange 209e may be so arranged that an angle therebetween is set to be 90°+θ. Such arrangement ensures that the inclination angle θ of the radiation fins 209 may be positively provided. The radiation fins 209 may be mounted on the fin mounting metal plate free from any slit. In addition, as shown in each of FIGS. 19 and 20, the flange 209e may be fixed directly on the front surface 105a of the base plate 105.

Figure 21:
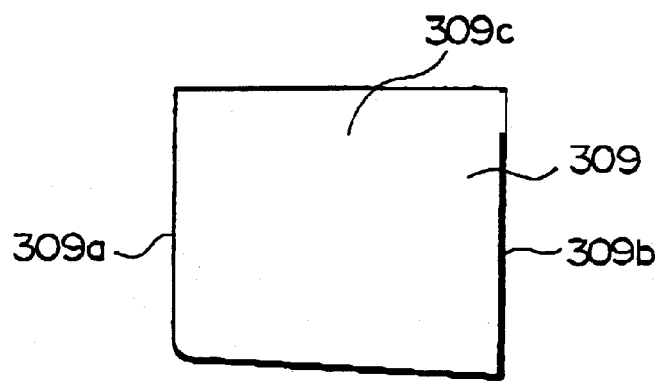
FIG. 21 is a schematic plan view showing another still another modification of the radiation fins shown in FIG. 14.
Figure 22:
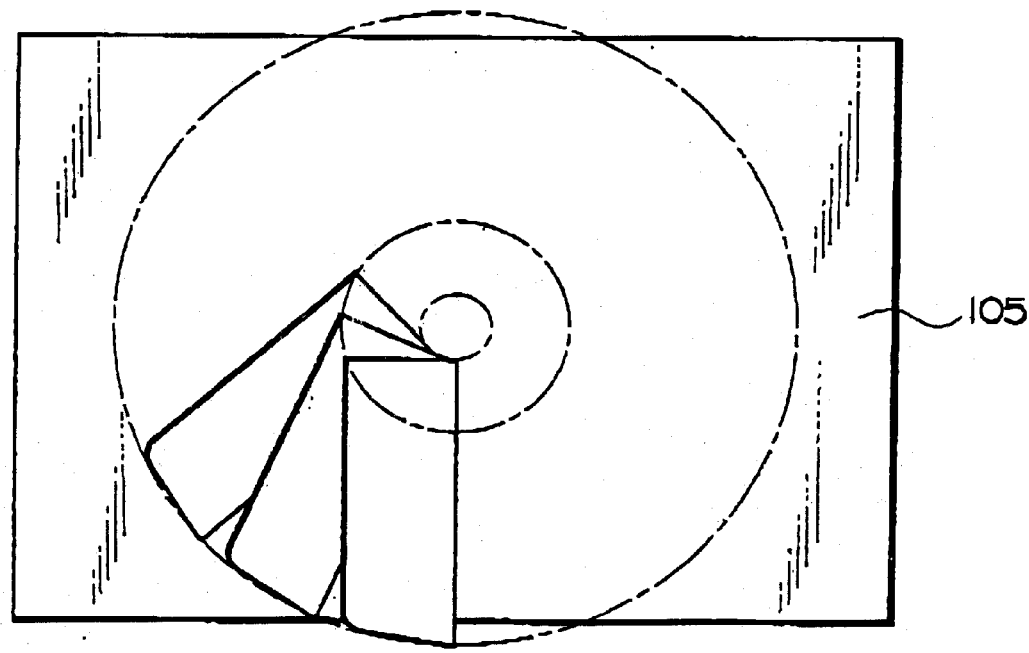
FIG. 22 is a schematic front elevation view showing manufacturing of another modification of the radiation fin unit of FIG. 12.

Further, a radiation fit unit may be constructed in such a manner as shown in FIGS. 21 and 22. More specifically, radiation fins 309 constructed in a simplified manner each are joined directly to the main plate 105.

As can be seen from the foregoing, the cooling apparatus of the present invention exhibits cooling performance at substantially the same level as an expensive cooling apparatus conventionally used without being increased in dimensions in a radial direction thereof and ensuring satisfactory durability of the motor.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A cooling apparatus comprising:

a heat sink to dissipate heat generated from a heat source;

said heat sink including a base plate increased in thermal conductivity and including a front surface and a rear surface with which the heat source is contacted, a virtual central line defined so as to extend in a direction perpendicular to said front surface of said base plate, a plurality of virtual vertical planes defined so as to extend in both a radial direction from said central line and a vertical direction perpendicular to said front surface of said base plate and be spaced from each other at equal intervals in a circumferential direction of a virtual circle defined about said central line, and a radiation fin unit mounted on said front surface of said base plate in a manner to be heat-transferable and including a plurality of radiation fins arranged so as to surround said central line while aligning said central line with a center in arrangement of said radiation fins; and a cooling fan including an impeller which includes a plurality of blades and is rotated by a motor and mounted on said heat sink so that said impeller is positioned above said radiation fin unit;

said radiation fins each including a lower edge, an upper edge positioned opposite to said lower edge, and a radiation surface positioned between said lower edge and said upper edge;

said lower edges of said radiation fins each being mounted on said front surface of said base plate in a manner to be heat-transferable and so as to be positioned on an intersection line between said virtual vertical plane corresponding to each of said lower edges and said front surface of said base plate;

said radiation fins each being arranged while being inclined in an identical direction with respect to said virtual vertical plane so that an inclination angle θ of predetermined degrees between said radiation surface of said radiation fins and said virtual vertical plane may be defined;

said radiation fin unit and cooling fan being arranged in positional relationship which permits each of said blades of said cooling fan and said upper edge of each of said radiation fins to be opposite to each other;

said cooling fan being arranged so as to permit cooling air to be fed to said radiation fins of said radiation fin unit.

2. The cooling apparatus as defined in claim 1, wherein said virtual vertical planes are defined so as to be spaced from each other at equal intervals in said circumferential direction of said virtual circle.

3. The cooling apparatus as defined in claim 1, wherein said radiation fin unit is formed by subjecting a single metal plate increased in thermal conductivity to bending.

4. The cooling apparatus as defined in claim 1, wherein said radiation fin unit includes a fin mounting metal plate joined to said front surface of said base plate; and, said radiation fins each are formed of a flat metal plate.

5. The cooling apparatus as defined in claim 4, wherein said radiation fins each are integrally mounted at said lower edge thereof with a flange for fixing;

said flange being arranged so as to extend along a surface of said fin mounting metal plate and fixed on said surface of said fin mounting metal plate.

6. The cooling apparatus as defined in claim 4, wherein said fin mounting metal plate is formed with a plurality of slits in a manner to radially extend from said central line and be spaced from each other at predetermined intervals in said circumferential direction;

said radiation fins each are integrally formed at said lower edge thereof with a fit projection which is fitted in each of said slits; and said radiation fins each are joined to said fin mounting metal plate while keeping said fit projection fitted in each of said slits.

7. The cooling apparatus as defined in claim 1, wherein said base plate is formed with a plurality of slits in a manner to radially extend from said central line and be spaced from each other at predetermined intervals in said circumferential direction;

said radiation fins each are integrally formed at said lower edge thereof with a fit projection which is fitted in each of said slits; and said radiation fins each are joined to said fin mounting metal plate while keeping said fit projection fitted in each of said slits.

8. The cooling apparatus as defined in claim 1, wherein said radiation fins each are integrally provided at said lower edge thereof with a flange for fixing;

said flange being arranged so as to extend along said front surface of said base plate and mounted on said front surface of said base plate.

9. The cooling apparatus as defined in claim 1, wherein said radiation fin unit is provided at a central portion thereof with a space of a frusto-conical configuration while having a center positioned on a central line of said radiation fin unit and being gradually reduced in diameter toward said base plate.

10. The cooling apparatus as defined in claim 4, wherein radiation fins each are formed into an identical shape.

11. The cooling apparatus as defined in claim 10, wherein said fin mounting metal plate and radiation fins each are made of a material selected from the group consisting of copper and copper alloy.

12. The cooling apparatus as defined in claim 1, wherein said inclination angle θ is less than 45 degrees.

13. The cooling apparatus as defined in claim 1, wherein said inclination angle θ is less than 45 degrees and more than 15 degrees.

14. The cooling apparatus as defined in claim 1, wherein said blades of said cooling fan are inclined in a direction identical to a direction in which said radiation fins are inclined; and said cooling fan rotates said impeller in the direction in which said radiation fins are inclined.

15. The cooling apparatus as defined in claim 1, wherein said air blown against said radiation fin unit from said cooling fan is permitted to enter a gap between each adjacent two of said radiation fins through an opening defined between the upper edges of each adjacent two of said radiation fins and then be radially outwardly discharged from said radiation fin unit through said gap.

16. The cooling apparatus as defined in claim 1, wherein said cooling fan includes a casing; and said motor includes a housing;

said casing of said cooling fan including a casing body provided with an air duct in a manner to surround at least a part of a periphery of said impeller, a plurality of webs for supporting said housing of said motor on said casing body, and a plurality of pillars each having a first end and a second end;

said first end of each of said plurality of pillars being mounted on said casing body and said second end of each of said plurality of pillars being held on said base plate; and said base plate is provided thereon with a plurality of holding portions, each of said holding portions holding the second end of one of the plurality of pillars.

17. A cooling apparatus comprising:

a heat sink to dissipate heat generated from a heat source;

said heat sink including a heat-transfer base plate and including a front surface and a rear surface with which the heat source is contacted, a virtual central line defined so as to extend in a direction perpendicular to said front surface of said base plate, a plurality of virtual vertical planes defined so as to extend in both a radial direction from said central line and a vertical direction perpendicular to said front surface of said base plate and be spaced from each other at equal intervals in a circumferential direction of a virtual circle defined about said central line, and a radiation fin unit mounted on said front surface of said base plate in a manner to be heat-transferable and including a plurality of radiation fins arranged so as to surround said central line while aligning said central line with a center in arrangement of said radiation fins;

said radiation fins each including a lower edge, an upper edge positioned opposite to said lower edge, and a radiation surface positioned between said lower edge and said upper edge;

said lower edges of said radiation fins each being mounted on said front surface of said base plate in a manner to be heat-transferable and so as to be positioned on an intersection line between said virtual vertical plane corresponding to each of said lower edges and said front surface of said base plate;

said radiation fins each being arranged while being inclined in an identical direction with said virtual vertical plane so that an inclination angle θ of predetermined degrees between said radiation surface of said radiation fins and said virtual vertical plane may be defined.

18. A cooling apparatus comprising:

heat sink for dissipating heat generated from a heat source;

said heat sink including a base plate increased in thermal conductivity and including a front surface and a rear surface with which the heat source is contacted, a virtual central line defined so as to extend in a direction perpendicular to said front surface of said base plate, a plurality of virtual vertical planes defined so as to extend in both a radial direction from said central line and a vertical direction perpendicular to said front surface of said base plate and be spaced from each other at equal intervals in a circumferential direction of a virtual circle defined about said central line, and a radiation fin unit mounted on said front surface of said base plate in a manner to be heat-transferable and including a plurality of radiation fins arranged so as to surround said central line while aligning said central line with a center in arrangement of said radiation fins; and a cooling fan including an impeller which includes a plurality of blades and is rotated by a motor and mounted on said heat sink so that said impeller is positioned above said radiation fin unit;

said radiation fins each including a lower edge, an upper edge positioned opposite to said lower edge, and a radiation surface positioned between said lower edge and said upper edge;

said lower edges of said radiation fins each being mounted on said front surface of said base plate in a manner to be heat-transferable and so as to be positioned on an intersection line between said virtual vertical plane corresponding to each of said lower edges and said front surface of said base plate;

said radiation fins each being arranged while being inclined in an identical direction with respect to said virtual vertical plane so that an inclination angle θ of predetermined degrees between said radiation surface of said radiation fins and said virtual vertical plane may be defined;

said radiation fin unit and cooling fan being arranged in positional relationship which permits each of said blades of said cooling fan and said upper edge of each of said radiation fins to be opposite to each other;

said radiation surface of each of said radiation fins and said virtual vertical plane being arranged with an angle of 90°−λ being defined therebetween, wherein λ is more than 45 degrees and less than 85 degrees (45°<λ<85°);

said radiation fins and base plate being formed so that a ratio C between a total radiation area F of said radiation fins and an area S of said base plate (C=F/S) is more than 10 and less than 40 (10<C<40);

said cooling fan being arranged so as to permit cooling air to be fed to said radiation fins of said radiation fin unit.

19. The cooling apparatus as defined in claim 14, wherein said air blown against said radiation fin unit from said cooling fan is permitted to enter a gap between each adjacent two of said radiation fins through an opening defined between the upper edges of each adjacent two of said radiation fins and then be radially outwardly discharged from said radiation fin unit through said gap.

* * * * *